United States Patent
Katz et al.

(10) Patent No.: US 8,618,482 B2
(45) Date of Patent: Dec. 31, 2013

(54) MOBILE DEVICE WITH PROXIMITY SENSOR

(75) Inventors: Marshall Joseph Katz, Palatine, IL (US); Ian Peter Lewis, Grayslake, IL (US)

(73) Assignee: BlackBerry Limited, Waterloo (CA)

( * ) Notice: Subject to any disclaimer, the term of this patent is extended or adjusted under 35 U.S.C. 154(b) by 259 days.

(21) Appl. No.: 13/032,104

(22) Filed: Feb. 22, 2011

(65) Prior Publication Data

US 2012/0211656 A1   Aug. 23, 2012

(51) Int. Cl.
    *G01J 5/00*    (2006.01)
(52) U.S. Cl.
    USPC ............ 250/338.1; 250/215; 250/214 DC; 250/372
(58) Field of Classification Search
    USPC ...... 250/338.1, 215, 214 DC, 372; 455/575.1
    See application file for complete search history.

(56) References Cited

U.S. PATENT DOCUMENTS

| | | | |
|---|---|---|---|
| 5,278,426 A * | 1/1994 | Barbier | 250/577 |
| 2003/0094566 A1* | 5/2003 | Hamalainen et al. | 250/221 |
| 2007/0085157 A1* | 4/2007 | Fadell et al. | 257/428 |
| 2008/0006762 A1* | 1/2008 | Fadell et al. | 250/201.1 |
| 2008/0090617 A1 | 4/2008 | Sutardja | |
| 2010/0046766 A1 | 2/2010 | Gregg et al. | |
| 2010/0207879 A1* | 8/2010 | Fadell et al. | 345/156 |
| 2012/0129579 A1* | 5/2012 | Tam | 455/575.1 |
| 2012/0129580 A1* | 5/2012 | Tam | 455/575.1 |

FOREIGN PATENT DOCUMENTS

| | | |
|---|---|---|
| EP | 0912031 A2 | 4/1999 |
| EP | 2204640 A1 | 7/2010 |
| GB | 2458832 A | 10/2009 |

OTHER PUBLICATIONS

Extended European Search Report dated Jul. 28, 2011. In corresponding application No. 11155290.7-1246, pp. 1-6.
Mohns, Robert, "Review: MacBook Pro (15" LED)", MacInTouch Special Reports, Jun. 10, 2007, http://www.macintouch.com/reviews/mbp15led.
MacRumors Forum, "The iPhone Nano Mock-up/Concept thread", http://forums.macrumors.com/showthread.php? p=3991451; published Jul.-Aug. 2007 and retrieved Oct. 12, 2010.

* cited by examiner

*Primary Examiner* — David Porta
*Assistant Examiner* — Gisselle Gutierrez
(74) *Attorney, Agent, or Firm* — Novak Druce Connolly Bove + Quigg LLP

(57) ABSTRACT

A mobile device including a source for emitting electromagnetic radiation, an enclosure having a side wall, and a detector for detecting electromagnetic radiation emitted by the source is described. At least a portion of the sidewall is adapted to transmit electromagnetic radiation from the source. The source and detector are positioned inside the enclosure. The detector is spaced from the source, and is arranged to detect electromagnetic radiation from the source that is reflected from an object outside the enclosure and passes through the portion of the side wall.

20 Claims, 5 Drawing Sheets

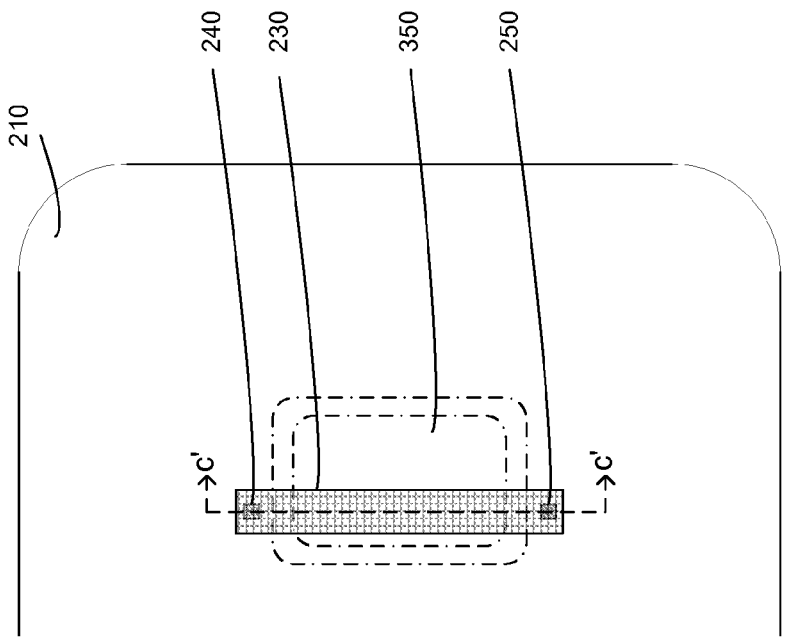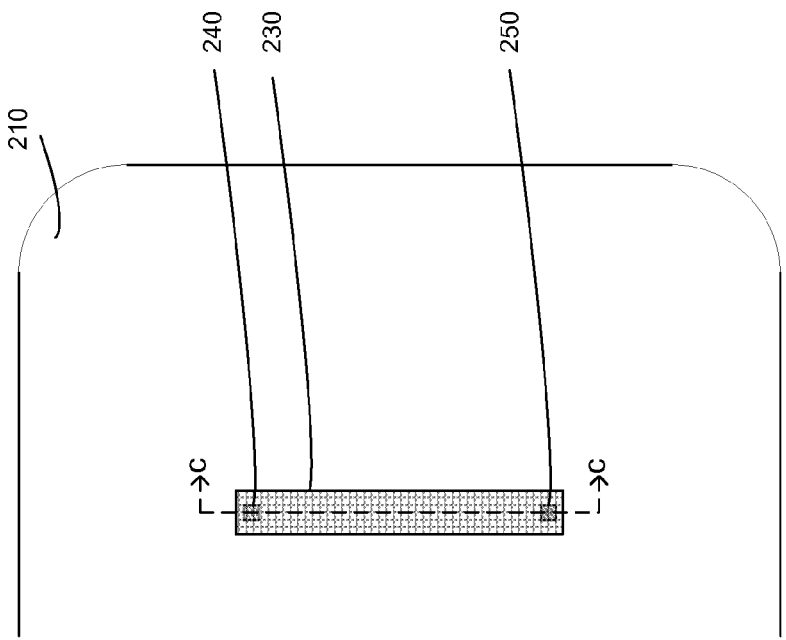

MOBILE DEVICE WITH PROXIMITY SENSOR

FIELD OF TECHNOLOGY

The present disclosure relates to electronic devices, including mobile devices having a proximity sensor.

BACKGROUND

Electronic devices, including handheld electronic communication devices, have gained widespread use and may provide a variety of functions including, for example, telephonic, electronic text messaging, personal information manager (PIM) application functions, mobile web browsing, and audio and video playback, among other things. Input to these devices can be provided through various components including touchscreens, keyboards, microphones, proximity sensors, cameras and accelerometers.

Consumer appeal and manufacturing costs are important considerations when designing these devices. Maintaining functionality while using fewer or simpler components is generally desirable for reducing manufacturing costs for such devices.

BRIEF DESCRIPTION OF THE DRAWINGS

Embodiments of the present disclosure will now be described, by way of example only, with reference to the attached Figures, wherein:

FIGS. 3A and 3B are rotated partial front elevation views of the portion of the mobile device defined by region A in FIG. 2;

DETAILED DESCRIPTION

Figure 1:
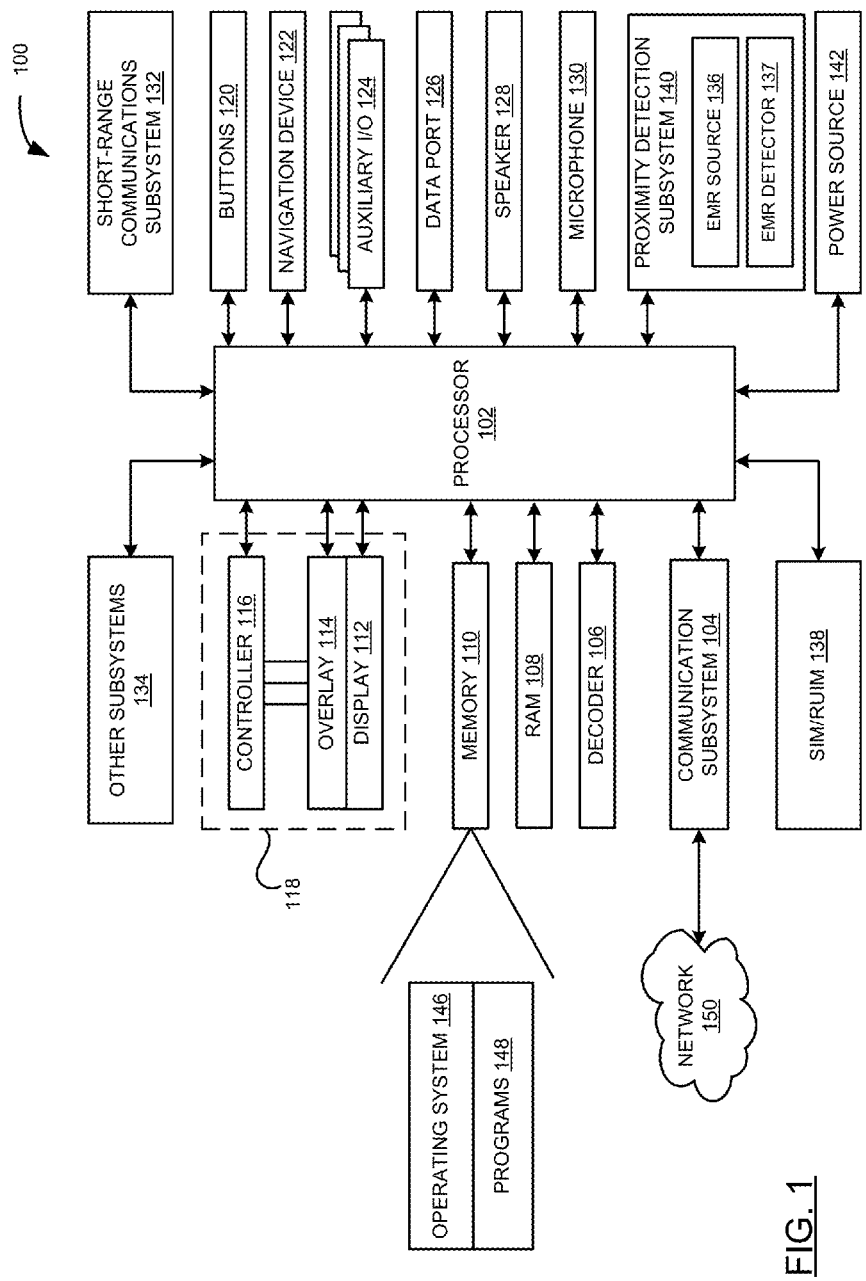
FIG. 1 is a simplified block diagram of components including internal components of a handheld electronic communication device according to an example embodiment.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein. Also, the description is not to be considered as limited to the scope of the example embodiments described herein.

Proximity sensors are commonly used to detect the presence of nearby objects. In mobile devices, proximity sensors may provide context to the current position or use of the mobile device.

For example, if the mobile device is a mobile phone with an active phone call connection, the proximity sensor may detect when the device is brought within close proximity of a user's face thereby notifying the device that it is being used in a talk position. This may trigger the device to disable the display and the touchscreen to save power and to prevent accidental touch inputs.

In another example, if the mobile device is placed inside a bag or pocket, the proximity sensor may detect the close proximity of the bag or pocket material and may disable any key inputs or may enter a power save mode.

Proximity sensors may be implemented using an electromagnetic radiation (EMR) source that emits an EMR beam, and an EMR detector for detecting EMR reflected off nearby objects. EMR sources and detectors are generally mounted inside a device, and are hidden behind a clear plastic window through which EMR can pass. This plastic window may be painted to match the color of the device housing EMR translucent paint. However, this adds additional complexity, components and cost to the device manufacturing process.

According to one example is a mobile device including a source for emitting electromagnetic radiation, an enclosure having a side wall, at least a portion of which is adapted to transmit electromagnetic radiation from the source, and a detector for detecting electromagnetic radiation emitted by the source. The source and detector are positioned inside the enclosure. The detector is spaced from the source, and is arranged to detect electromagnetic radiation from the source that is reflected from an object outside the enclosure and passes through the portion of the side wall.

In one embodiment the enclosure is an acoustic enclosure. In another embodiment, the acoustic enclosure is a speaker enclosure. In yet a further embodiment, a speaker is positioned between the source and detector within the acoustic enclosure.

Reference is made to FIG. 1, which illustrates in block diagram form, a mobile device 100 to which example embodiments described in the present disclosure can be applied. The mobile device 100 includes multiple components, such as a processor 102 that controls the overall operation of the mobile device 100. Communication functions, including data and voice communications, are performed through a communication subsystem 104. Data received by the mobile device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the mobile device 100.

The processor 102 interacts with other components, such as Random Access Memory (RAM) 108, memory 110, a display 112 (such as a liquid crystal display (LCD)) with a touch-sensitive overlay 114 coupled to an electronic controller 116 that together comprise a touch-sensitive display 118, one or more keys or buttons 120, a navigation device 122, one or more auxiliary input/output (I/O) subsystems 124, a data port 126, a speaker 128, a microphone 130, short-range communications subsystem 132, and other device subsystems 134. It will be appreciated that the electronic controller 116 of the touch-sensitive display 118 need not be physically integrated with the touch-sensitive overlay 114 and display 112. User-interaction with a graphical user interface (GUI) is performed through the touch-sensitive overlay 114. The GUI displays user interface screens on the touch-sensitive display 118 for displaying information or providing a touch-sensitive onscreen user interface element for receiving input. This content of the user interface screen varies depending on the device state and active application, among other factors. Some user interface screens may include a text field sometimes called a text input field. The processor 102 interacts with the touch-sensitive overlay 114 via the electronic controller 116. Information, such as text, characters, symbols, images, icons, and other items that may be displayed or rendered on a mobile device, is displayed on the touch-sensitive display 118 via the processor 102.

The auxiliary I/O subsystems 124 could include other input devices such as one or more control keys, a keyboard or keypad, navigational tool (input device), or both. The navigational tool may be a depressible (or clickable) joystick such as a depressible optical joystick, a depressible trackball, a depressible scroll wheel, or a depressible touch-sensitive trackpad or touchpad. The other input devices could be included in addition to, or instead of, the touch-sensitive display 118, depending on the embodiment.

To identify a subscriber for network access, the mobile device 100 uses a Subscriber Identity Module or a Removable User Identity Module (SIM/RUIM) card 138 for communication with a network, such as the wireless network 150. Alternatively, user identification information may be programmed into memory 110.

The mobile device 100 includes an operating system 146 and software programs or components 148 that are executed by the processor 102 and are typically stored in a persistent, updatable store such as the memory 110. Additional applications or programs may be loaded onto the mobile device 100 through the wireless network 150, the auxiliary I/O subsystem 124, the data port 126, the short-range communications subsystem 132, or any other suitable subsystem 134.

A received signal such as a text message, an e-mail message, or web page download is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104. For voice communications, the overall operation of the mobile device 100 is similar. The speaker 128 outputs audible information converted from electrical signals, and the microphone 130 converts audible information into electrical signals for processing.

The mobile device 100 also has a proximity detection subsystem 140 including at least one electromagnetic radiation (EMR) source 136 and at least one EMR detector 137 which are coupled to the processor 102 and which are controlled by one or a combination of a monitoring circuit, a control circuit and operating software. The EMR source 136 can be configured to emit EMR from the device and in some examples may be configured to emit EMR in specific pulses, patterns or at different intensities. In some examples, the EMR source 136, such as a light-emitting diode (LED), emits EMR having a specific wavelength such as infrared (IR) or near-infrared wavelengths.

The EMR detector 137 detects incident EMR and generates and outputs an electrical signal representative of the detected EMR. Changes in the intensity of the EMR incident on the EMR detector 137 produces corresponding changes in the electrical signal output of the detector 137. In some examples, the EMR detector 137 is configured to detect EMR having wavelengths that fall within a specific range. This range includes at least a portion of the EMR emitted by the EMR source 136.

In some examples, the EMR emitted by the source 136 and detected by the detector 137 may fall within any range of the electromagnetic spectrum that is suitable for use with a mobile device. This range may include but is not limited to infrared, ultraviolet or visible light.

The EMR source 136 and EMR detector 137 are positioned such that EMR from the EMR source 136 is emitted from the mobile device 100 and may be reflected by objects within close proximity of the device back towards the EMR detector 137. The proximity detection subsystem 140 may be configured to emit different EMR pulses, intensities and/or waveforms from the EMR source 136, and to detect on the EMR detector 137 the corresponding reflected EMR. The mobile device 100 may interpret the detected EMR patterns and the timing of these patterns to determine the distance and/or shape of an object from which the EMR signals were reflected.

Upon detecting that an object is within a predetermined proximity of the mobile device 100, the processor may be configured to perform any number of operations. For example, if the mobile device 100 is detected as being close to an object such as a user's ear or the inside of a purse, the mobile device 100 may be configured to turn off the display 112 or to disable the touch-screen 118 from receiving input.

In some examples, the EMR source 136 may be configured to emit EMR at specific wavelengths, intensities or modulation frequencies to distinguish its signals from other external EMR sources.

Figure 2:
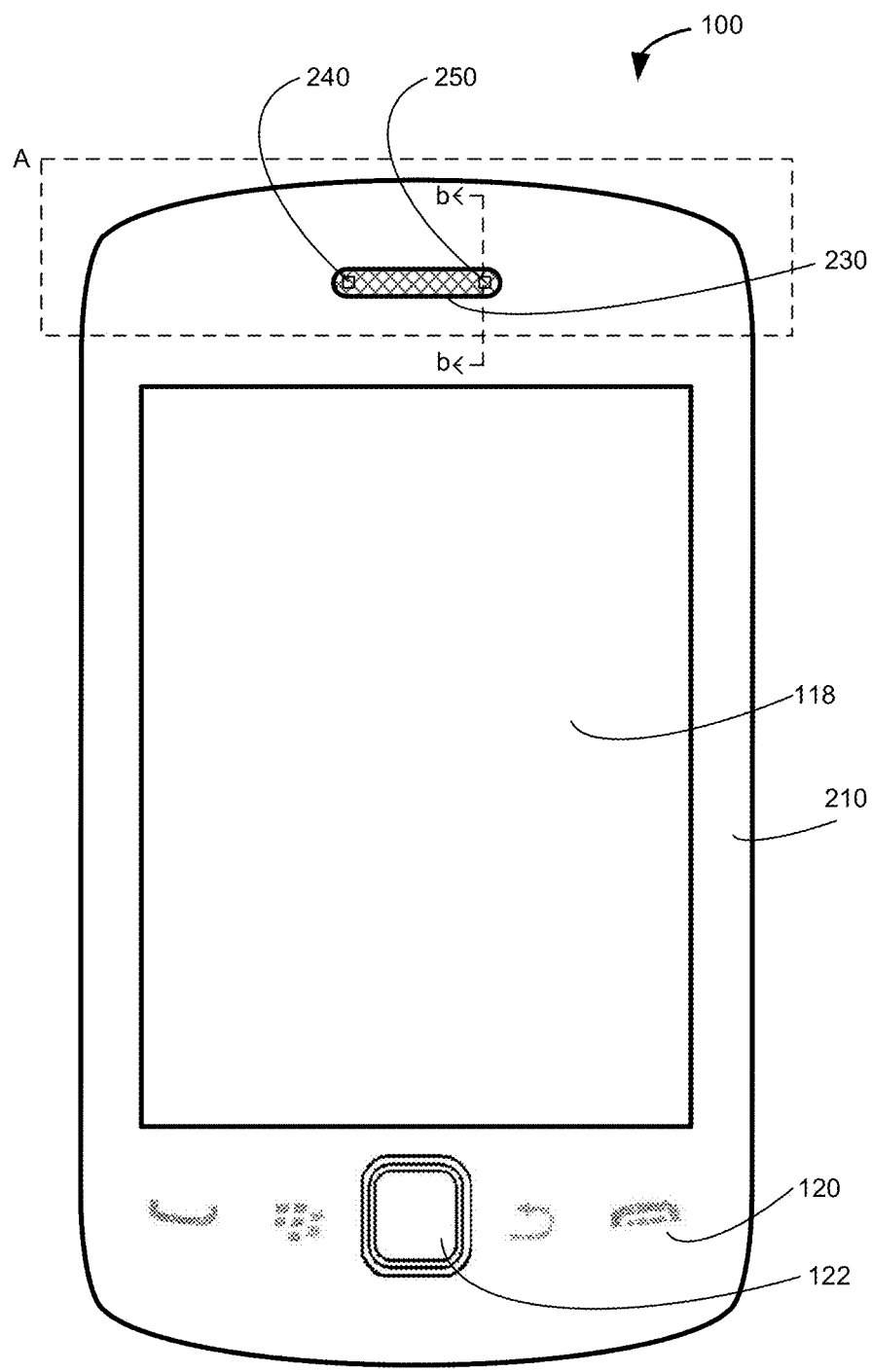
FIG. 2 is a front elevation view of an example of a handheld electronic communication device including a sidewall portion adapted to transmit electromagnetic radiation.

Referring to FIG. 2, a front elevation view of an example mobile device 100 is shown. The mobile device 100 includes a housing 210 which forms the external structure of the mobile device 100. The housing 210 may be constructed from one or more members, and houses the internal components of the mobile device 100 such as the processor 102 and other components illustrated in FIG. 1. In some examples, the housing also has one or more openings or sockets for mounting external components such as the display screen 118, keys 120, and a navigation device 122.

In accordance with one aspect of the present disclosure, the mobile device 100 includes a sidewall portion 230 through which EMR waves can pass while providing a degree of protection from external objects. The sidewall portion 230 defines part of an acoustic enclosure for housing a transducer. In some examples, sound waves travelling to or from the transducer may pass through the sidewall portion 230.

The sidewall portion 230 may be a material through which EMR waves can pass, or may include apertures or pores in the material through which EMR waves can pass. In some examples, the sidewall portion 230 material and apertures may form a grille as illustrated in FIG. 2. In other examples, the sidewall portion 230 may be a solid or porous material through which EMR waves can pass such as glass, polymers or any other optical material.

In some examples, the sidewall portion 230 may be a region of the housing material having a plurality of apertures. In other examples, the sidewall portion 230 may be a separate material mounted to an opening in the housing 210. In some examples, the sidewall portion 230 may be a rigid material such as metal or plastic with a plurality of apertures. In one example, the sidewall portion 230 may be molded to form a material with apertures. In another example, the sidewall portion 230 may be formed by drilling, punching, or otherwise cutting apertures into a solid board or sheet of material. In yet another example, the sidewall portion 230 may be formed by weaving or crosshatching strips of material. In other examples, the sidewall portion 230 may be a flexible material such as a fabric or material composed of weaved wire or thread.

The sidewall portion 230 may permit sound waves to be emitted through the housing of the device 100, and in some examples, the sidewall portion 230 may be designed to reduce distortion to sound waves as they pass through the sidewall portion 230.

Behind the sidewall portion 230 are an EMR source 240 and an EMR detector 250 which will be described in further detail below.

While the sidewall portion 230 is illustrated on the upper front portion of the mobile device 100, in other examples, the sidewall portion 230 and the underlying EMR source 240 and EMR detector 250 may be positioned anywhere on the housing 210 and on any face of the housing 210.

Referring to FIG. 3A, a portion of the housing 210 with a sidewall 230 is illustrated. In this example arrangement, the EMR source 240 and the EMR detector 250 are mounted inside the housing 210 and are positioned behind the sidewall portion 230. The EMR source 240 and EMR detector 250 are spaced apart to reduce EMR waves from travelling directly from the source 240 to the detector 250 without first passing through the sidewall portion 230 and reflecting off an external object.

FIG. 3B shows another example portion of the housing 210 with sidewall portion 230. In this example, a transducer 350 is mounted inside the housing 210 and behind the sidewall portion 230. In some examples, the transducer 350 is positioned between the EMR source 240 and the EMR detector 250.

In some examples, the transducer 350 may be a speaker such as a piezoelectric actuator or similar device for converting an electrical signal into sound. In other examples, the transducer 350 may be a microphone such as a piezoelectric sensor or similar device for converting sound into electrical signals.

Figure 4A:
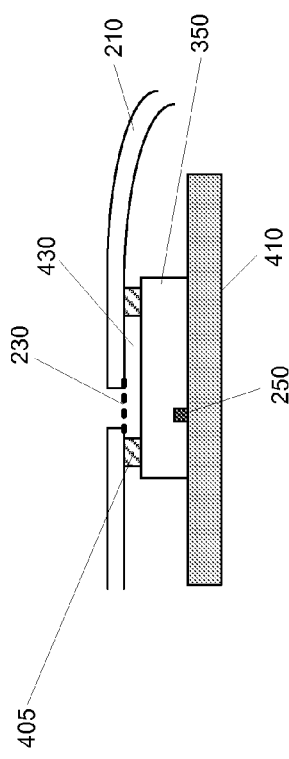
FIGS. 4A and 4B show partial cross-sectional views of the example mobile device as seen from b-b in FIG. 2.
Figure 4B:
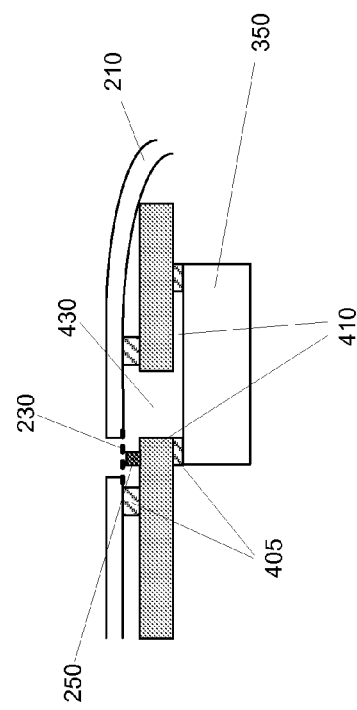

FIGS. 4A and 4B show partial cross-sectional views of the example mobile device 100 with a sidewall portion 230 and transducer 350 as seen from b-b in FIG. 2.

In FIG. 4A, the EMR detector 250, EMR source (not shown), and the transducer 350 are mounted on the top side of a printed circuit board (PCB) 410 inside the housing 210 and beneath the sidewall portion 230 inside acoustic enclosure 430. A seal or gasket 405 is placed between the transducer 350 and the housing 210 to prevent external elements such as water or dust from reaching other internal components of the device.

The sidewall portion 230, gasket 405 and portions of the PCB 410 define an acoustic enclosure 430 through which EMR and sound may travel. In some examples, the acoustic enclosure 430 may be further defined by interior walls, the transducer 350, or other components in the device 100.

In FIG. 4B, the EMR detector 250 and EMR source (not shown) are mounted on the top side of the PCB 410, and the transducer 350 is mounted on the bottom side of the PCB 410 beneath an opening in the PCB 410. In this example, a protective seal or gasket 405 is placed between the housing 210 and the PCB 410, and between the PCB 410 and the transducer 350. In this configuration, the EMR detector 250 and the EMR source (not shown) are closer to the sidewall portion 230 than they are in the example illustrated in FIG. 4A.

Figure 5A:
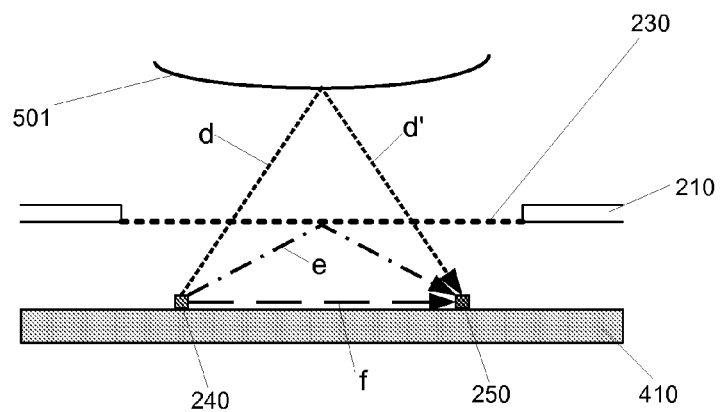
FIGS. 5A and 5B show partial cross-sectional views of the example mobile device 100 as seen from c-c in FIG. 3A, and c'-c' in FIG. 3B respectively.

FIG. 5A shows a partial cross-sectional view of the example mobile device 100 as seen from c-c in FIG. 3A, and illustrates three example EMR ray paths between the EMR source 240 and the EMR detector 250.

Ray d illustrates a path of an EMR ray that is emitted from EMR source 240, passes through an aperture in the sidewall portion 230, and reflects off an outside object 501 such as a user's face. The reflected ray d' passes through another aperture in the sidewall portion 230, and is incident on the EMR detector 250.

Ray e illustrates a path of an EMR ray that is emitted from EMR source 240, reflects off the inner surface of the sidewall portion 230 and is incident on the EMR detector 250.

Ray f illustrates a path of an EMR ray that is emitted from EMR source 240 and is directly incident on the EMR detector 250.

The detection of rays following paths e and f are false positives and may incorrectly indicate that an external object is within close proximity of the mobile device 100. In some examples, these false positives may be reduced by configuring the EMR source 240 to emit EMR in a narrower beam such that EMR reflected off the sidewall portion 230 is not incident on the EMR detector 250, and to shield any direct line of sight between the source 240 and the detector 250. In some examples, the narrower EMR beam may be shaped by using reflectors or barriers to control the path of the emitted EMR.

Similarly, the EMR detector may be configured to only sense incoming EMR having a smaller angle of incidence. In some examples, the detector 250 is adapted to have a narrower field of view to reduce false positives and to shield any direct line of sight between the source 240 and the detector 250. In some examples, the detector's field of view may be narrowed by using reflectors or barriers.

In other examples, false positives may be reduced by configuring the processor to filter, subtract, or otherwise ignore all EMR detector detections caused by EMR reflecting off the inner surface of the sidewall portion 230. In some examples, these detections may be distinguished by determining the distance between the EMR detector and the reflecting object. The distance may be determined using the intensity, timing, and/or pattern of the EMR incident on the EMR detector.

In some examples, positioning the EMR source 240 and the EMR detector 250 father apart may allow the EMR source 240 to be configured to have a wider EMR beam before false positives come into play. Similarly, positioning the EMR source 240 and the EMR detector 250 father apart may allow the EMR detector 250 to be configured to detect EMR having larger angles of incidence (i.e. the detector may be configured to have a wider field of view) before false positives come into play.

In some examples, positioning the EMR source 240 and the EMR detector 250 closer to the grille 230 may reduce false positives and may allow the EMR source and detector to have wider emission and sensing fields.

Figure 5B:
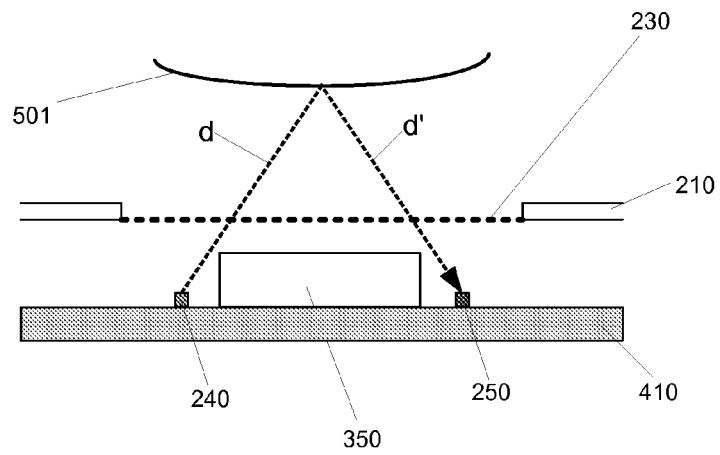

FIG. 5B shows a partial cross-sectional view of the example mobile device 100 as seen from c'-c' in FIG. 3B. In this example, the transducer 350 blocks any direct line of sight between the EMR source 240 and the EMR detector 250 eliminating false positives caused by EMR rays travelling along path f (FIG. 5A). In some examples, the transducer 350 may also reduce or eliminate false positives by blocking EMR rays travelling along path e (FIG. 5A).

In other examples, the EMR source 240 and/or the EMR detector 250 may be positioned inside the transducer. In some examples, the EMR source and/or detector may be positioned behind a clear transducer diaphragm.

While the embodiments described herein are directed to particular implementations of the mobile device, it will be understood that modifications and variations may occur to those skilled in the art having read the present disclosure. All such modifications and variations are believed to be within the sphere and scope of the present disclosure.

What is claimed is:

1. A mobile device comprising:
   a source for emitting electromagnetic radiation;
   a transducer;
   an enclosure having a side wall, at least a portion of the side wall being both sound permeable and adapted to transmit electromagnetic radiation from the source; and
   a detector for detecting electromagnetic radiation emitted by the source in use, the source, detector and transducer being positioned inside the enclosure, wherein the transducer is positioned between the source and the detector;
   wherein the detector is spaced from the source, and is arranged to detect electromagnetic radiation from the source that is reflected from an object outside the enclosure and passes through the portion of the side wall.

2. The mobile device of claim 1 wherein the transducer blocks a direct line of sight between the source and the detector.

3. The mobile device of claim 1 wherein the transducer is a speaker or a microphone.

4. The mobile device of claim 1 wherein electromagnetic radiation emitted from the source is shaped to shield a direct line of sight between the source and the detector.

5. The mobile device of claim 1 wherein the detector has a field of view which is shaped to shield a direct line of sight between the source and the detector.

6. The mobile device of claim 1 wherein the sound permeable portion of the side wall is a grille.

7. The mobile device of claim 1 further comprising a printed circuit board (PCB); the source and the detector being mounted on the PCB.

8. The mobile device of claim 1 further comprising a printed circuit board (PCB); the source, the detector and the transducer being mounted on the PCB.

9. The mobile device of claim 8 wherein the source and the detector are mounted on a first side of the PCB, and the transducer is mounted on a second side of the PCB.

10. The mobile device of claim 1 further comprising a processor, the processor being configured to receive detection information from the detector.

11. The mobile device of claim 10, the processor being further configured to filter detection information for electromagnetic radiation detected by the detector that has reflected off an inside surface of the enclosure.

12. The mobile device of claim 1 wherein at least a portion of the electromagnetic radiation emitted by the source and detected by the detector falls within the electromagnetic spectrum range of infrared light.

13. The mobile device of claim 1, wherein the mobile device is a communication device configured to connect to a server over at least one mobile network.

14. The mobile device of claim 1 wherein at least a portion of the electromagnetic radiation emitted by the source and detected by the detector falls within the electromagnetic spectrum range of ultraviolet light.

15. The mobile device of claim 1 wherein at least a portion of the electromagnetic radiation emitted by the source and detected by the detector falls within the electromagnetic spectrum range of visible light.

16. The mobile device of claim 1 comprising a proximity sensor implemented using the source and the detector.

17. A mobile device comprising:
    an acoustic enclosure having a wall portion that is both sound permeable and adapted to transmit electromagnetic radiation,
    a proximity sensor, and an acoustic transducer positioned within the acoustic enclosure between a source for emitting electromagnetic radiation and a detector for detecting electromagnetic radiation emitted by the source, the proximity sensor being arranged to detect electromagnetic radiation that passes through the wall portion.

18. The mobile device of claim 17 wherein the acoustic enclosure is a speaker enclosure and the transducer is a speaker.

19. The mobile device of claim 17 wherein the transducer is a microphone.

20. The mobile device of claim 17 wherein the detector is arranged to detect the electromagnetic radiation from the source that is reflected from an object outside the enclosure and passes through the wall portion.

* * * * *